United States Patent
Ching et al.

(10) Patent No.: US 6,623,912 B1
(45) Date of Patent: Sep. 23, 2003

(54) METHOD TO FORM THE RING SHAPE CONTACT TO CATHODE ON WAFER EDGE FOR ELECTROPLATING IN THE BUMP PROCESS WHEN USING THE NEGATIVE TYPE DRY FILM PHOTORESIST

(75) Inventors: Kai-Ming Ching, Taiping (TW); Yu-Kung Hsiao, Tan-Yuan (TW); Sheng-Liang Pan, Hsinchu (TW); Kuo-Liang Lu, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/867,094

(22) Filed: May 30, 2001

(51) Int. Cl.[7] .............................. G03F 7/30; G03F 7/38; G03F 7/11
(52) U.S. Cl. ..................... 430/314; 430/311; 430/314
(58) Field of Search ............... 430/327, 314, 430/311

(56) References Cited

U.S. PATENT DOCUMENTS

| | | | |
|---|---|---|---|
| 3,591,378 A | 7/1971 | Attman ................. | 96/35.1 |
| 4,273,859 A | 6/1981 | Mones et al. ............. | 430/315 |
| 5,323,535 A | 6/1994 | Sakaki et al. ............. | 29/852 |
| 5,750,317 A * | 5/1998 | Orth ..................... | 430/327 |
| 5,933,758 A | 8/1999 | Jain ..................... | 438/687 |
| 6,132,587 A | 10/2000 | Jorné et al. ............. | 205/123 |

OTHER PUBLICATIONS

"Photoinitiated Polymerization," Chapter 4, *Photoreactive Polymers the Science and Technology of Resists*, ISBN 0–471–85550–2 Arnest Reiser, John Wiley & Sons Publisher, 1988 pp. 102, 103, 128, 129, & 162–165.
The Article "Dry Film Photoresists," Robert H. Wopschall, *Solid State Technology*, Jun. 1986, pp. 153–157.
"Negative Photoresists," Chapter 4, *Semiconductor Lithography Principles, Practices and Materials*, ISBN 0–306–42185–2 Wayne M. Moreau, Plenum Press Publisher, 1987, Third Printing—Jul. 1991, pp. 190–194 and 209.
Excerpt From *The Condensed Chemical Dictionary*, Tenth Edition Revised by Gessner G. Hawley, C. 1981, p. 840.
The Technical Information Sheet; Poly(2–ethyl–2–oxazoline); CAS No.: 25805–17–18 Available at http://www.polychemistry.com/products/aquazol.html on the World Wide Web.

* cited by examiner

Primary Examiner—Richard L. Schilling
(74) Attorney, Agent, or Firm—George O. Saile; Stephen B. Ackerman; Stephen G. Stanton

(57) ABSTRACT

A method of clearing photoresist on a wafer edge, including the following steps. A wafer having a upper exposed conductive layer is provided. The wafer having a center, an edge and a ring-shaped area proximate the wafer edge. A photoresist layer is formed upon the exposed conductive layer. The photoresist layer is removed from within the ring-shaped area by a rinse process to expose the conductive layer within the ring-shaped area. An oxygen diffusion barrier layer is formed over the photoresist layer.

39 Claims, 5 Drawing Sheets

METHOD TO FORM THE RING SHAPE CONTACT TO CATHODE ON WAFER EDGE FOR ELECTROPLATING IN THE BUMP PROCESS WHEN USING THE NEGATIVE TYPE DRY FILM PHOTORESIST

FIELD OF THE INVENTION

The present invention relates generally to semiconductor fabrication and more specifically to a method of forming a ring shaped electrode contact for wafer electroplating.

BACKGROUND OF THE INVENTION

In the current electroplating design, a cathode electrode contact to the wafer edge is in the shape of a ring, and the seal packaging also seals the wafer edge to enclose the plating solution. This ring contact region must be free of any photoresist.

If liquid photoresist (positive and negative type) and a stepper or scanner are used, the liquid photoresist on the wafer edge can be cleared in a resist coater.

U.S. Pat. No. 5,323,535 to Sakaki et al. describes an electrical connecting member and a method of manufacturing the electrical connecting member.

U.S. Pat. No. 6,132,587 to Jorné et al. describes an electroplating device for wafer metallization of a wafer for interconnection and a method of electroplating for the metallization of wafers for interconnection.

U.S. Pat. No. 5,933,758 to Jain describes a method for preventing electroplating of copper on an exposed surface at the edge exclusion or a semiconductor wafer.

U.S. Pat. No. 4,273,859 to Mones et al. describes a method of forming solder bump terminals on semiconductor elements using a dry film resist process.

U.S. Pat. No. 3,591,378 to Altman describes a positive photoresist process for making photomechanical reproductions.

"Photoinitiated Polymerization," Chapter 4, *Photoreactive Polymers The Science and Technology of Resists*, ISBN 0-471-85550-2 Arnost Reiser, John Wiley & Sons publisher, 1988 pages 102, 103, 128, 129 and 162 to 165; describes photoinitiated polymerization, oxygen reaction with initiating radicals, and dry resist techniques.

The article "Dry Film Photoresists," Robert H. Wopschall, *Solid State Technology*, June 1986, pages 153 to 157; describes the structure and uses of dry film photoresists.

"Negative Photoresists," Chapter 4, *SemiConductor Lithography Principles, Practices and Materials*, ISBN 0-306-42185-2, Wayne M. Moreau, Plenum Press publisher, 1987, Third Printing—July 1991, pages 190 to 194 and 209; describes oxygen effects in azide resists.

The excerpt from *The Condensed Chemical Dictionary*, Tenth Edition, revised by Gessner G. Hawley, copyright 1981, page 840, gives a definition of "polyvinyl alcohol."

The Technical Information Sheet; Poly (2-ethyl-2-oxazoline); CAS Number: 25805-17-18 available at http://www.polychemistry.com/Products/aquazol.html on the world wide web; discusses Aquazol (poly (2-ethyl-2-oxazoline)).

SUMMARY OF THE INVENTION

Accordingly, it is an object of the present invention to provide a method of clearing the dry film photoresist on a wafer edge to form a contact to the electrode of an electroplater.

Other Objects will Appear Hereinafter

It has now been discovered that the above and other objects of the present invention may be accomplished in the following manner. Specifically, a wafer having a upper exposed conductive layer is provided. The wafer having a center, an edge and a ring-shaped area proximate the wafer edge. A photoresist layer is formed upon the exposed conductive layer. The photoresist layer is removed from within the ring-shaped area by a rinse process to expose the conductive layer within the ring-shaped area. An oxygen diffusion barrier layer is formed over the photoresist layer.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, steps, methods, etc. may be formed or accomplished by conventional steps or methods known in the prior art.

Problem Discovered by the Inventors

Currently, the electroplating in some bump houses use the jig or fixture to clamp and contact the wafer at several contact points to conduct the electric current for electroplating. Reticules and stepper job files are used to form the contact points.

But for recently developed electrode plating tools, the electrode contact for the anode is an exposed ring shape at the wafer edge. The exposed wafer edge ring is from about 1 to 3 mm wide, depending upon the design of the electroplater. If a liquid PR (positive and negative type) and a stepper or scanner is used, it is possible to clear the liquid PR on the wafer edge by wafer-edge rinsing in a resist coater. For example, a current process for wafer bumping known to the inventors, using liquid PR, comprises the steps:

1) seed metal sputter;
   2) liquid PR deposit/expose/develop;
   3) wafer edge rinse of liquid PR (may be done before the liquid PR exposure/development portion of step 2));
   4) contact ring shaped anode to the liquid PR-free wafer edge and electroplate bump metal or re-route trace;
   5) remove developed liquid PR; and
   6) seed metal etch.

However, the inventors have discovered that if dry photoresist (PR) and a stepper or scanner are used, problems arise in attempting to clear the dry photoresist on the wafer edge.

Figure 1:
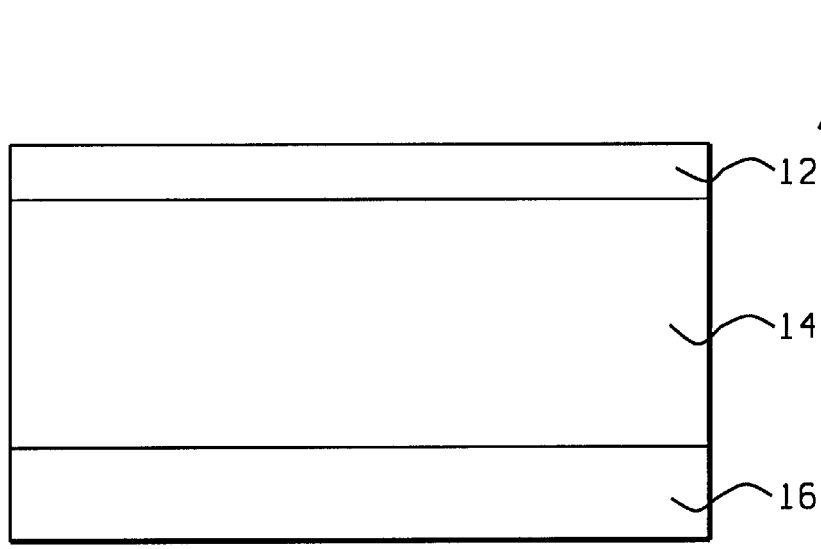
FIG. 1 is a cross-sectional view of a dry film photoresist (DFR).

As shown in FIG. 1, dry film photoresist 10, or dry film resist (DFR), is a three-layer structure stored on a roll and consists of:

(1) a polyester (PET) cover sheet 12 protecting the dry photopolymerizable resist (photoresist) 14 from oxygen diffusion and from mechanical damage;

(2) a photopolymerizable resist layer 14 (for example negative type photoresist); and (3) a polyolefin separator sheet 16 (to separate adjacent sections of the DFR 10 while stored on the roll).

Figure 2:
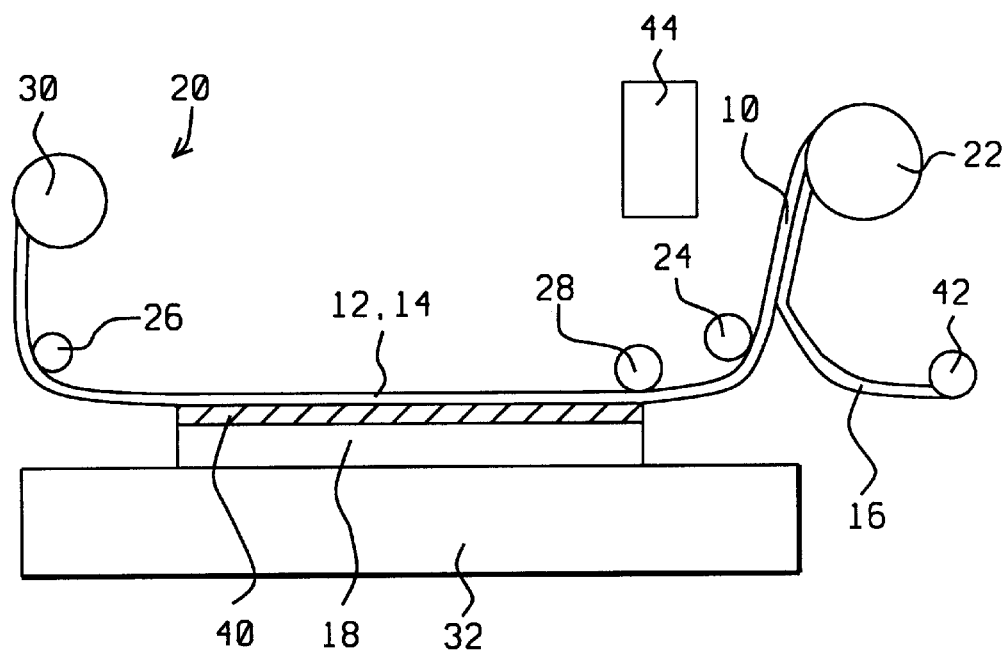
FIG. 2 is a schematic cross-sectional view illustrating laminating a DFR onto a wafer.

As shown in FIG. 2, application of the DFR 10 stored on a roll 22 to a wafer 18 having an upper, exposed seed metal layer 40 is accomplished with a laminator 20. Laminator 20 includes rollers 24, 26 and pressure and heat roller 28. The DFR 10 is unwound from roll 22 to take-up roll 30 and contacts wafer 18 over heat stage 32 by rollers 24, 26 and heat and pressure roller 28. The heat and pressure roller 28 and heat stage 32 have set temperatures dictated by the specific DFR 10 used.

After laminating the DFR 10 upon the wafer 18, only the photopolymerizable resist layer (resist layer) 14 and the PE sheet 12, which is on top of the resist layer 14 remain on the wafer 18 as the polyolefin (PE) separator sheet 16 is removed to the PE sheet take-up roller 42 as the DFR 10 is applied to the wafer 18. Cutting laser 44 separates laminated DFR 10 from the bulk of the DFR 10 on roll 22 after lamination to wafer 18.

In the traditional dry film photoresist patterning process, the resist layer is exposed with the PE sheet overlying the resist layer. The function of the PE sheet is to act as a topcoat over the resist layer to prevent external oxygen from reacting with the photo initiator during exposure. The PE sheet is then peeled off and the resist layer is developed with an aqueous solution of from about 0.5 to 1.0% $Na_2CO_3$.

The unexposed DFR is soluble in acetone. However the exposed DFR is hardly dissolvable in any solvent. Even in a dry film stripper, it can take up to about 10 minutes to strip exposed DFR.

PREFERRED EMBODIMENT OF THE PRESENT INVENTION

BRIEF SUMMARY OF THE PRESENT INVENTION

The inventors have discovered the following process permits use of dry film resist (DFR) 10 for wafer bumping:

1) seed metal 40 sputter upon the wafer 18;

2) laminate photoresist/DFR 10 onto the wafer 18 (leaving PE sheet 12 over the dry photoresist 14);

3) remove/peel-off the PE sheet 12 from over the dry film resist layer 14;

4) acetone rinse the dry photoresist 14 to remove the dry film resist layer within the ring-shaped area 60 at the edge 62 of the wafer 18;

5) spin coat a water soluble polymer top coating 50 to form an oxygen barrier over the uncovered dry film resist layer 14; the water soluble polymer can be dissolved in aqueous developer;

6) expose the dry film resist layer 14';

7) simultaneously rinse away the polymer top coating 50 and develop the photoresist/dry film resist layer 14';

8) contact ring shaped electrode to exposed seed metal 40 at the ring-shaped area 60 at the edge 62 of the wafer 18;

9) electroplate bump metal formation or re-route trace;

10) remove the developed dry film resist layer 14'; and 11) seed metal layer 40 etch.

Initial Structure—Seed Metal Layer 40 Sputter and DFR 10 Lamination

Figure 3:
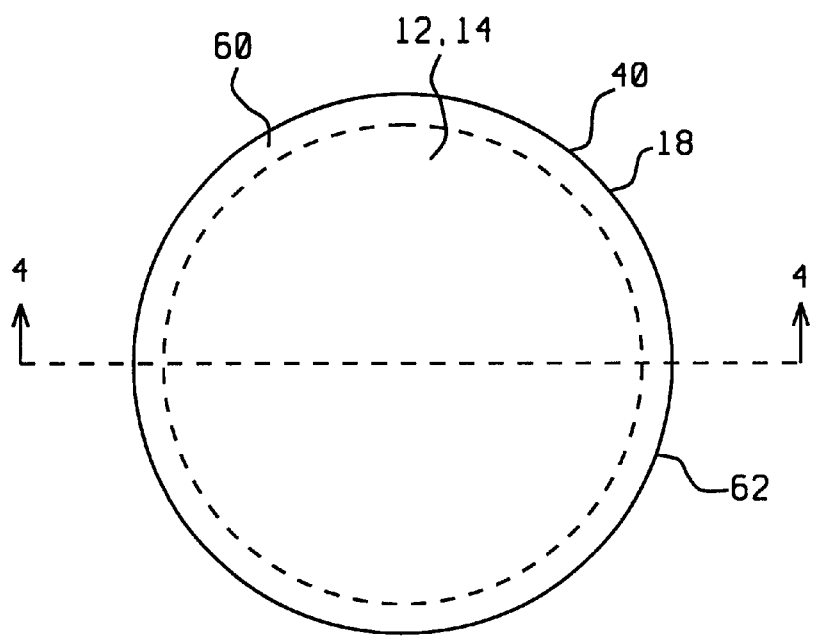
FIG. 3 is a schematic, top view of a wafer laminated with a DFR.
Figure 4:
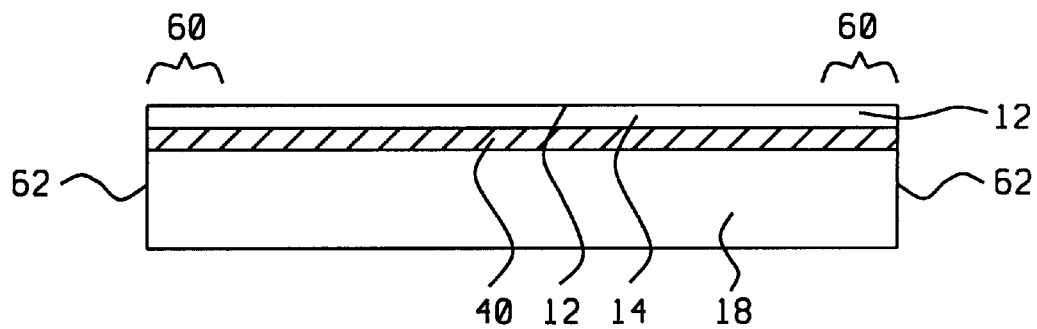
FIGS. 4 to 13 illustrate a preferred embodiment of the present invention with FIG. 4 being a schematic, cross-sectional view taken along line 4—4 of FIG. 3.

As shown in FIGS. 3 and 4, seed metal layer 40 is sputtered upon the top side of wafer 18 to a preferable thickness of from about 1000 to 8000 Å and more preferably to a thickness of from about 4000 to 6000 Å. Photoresist 10 is then formed upon seed metal layer 40 as shown in FIG. 2. Photoresist 10 is preferably dry film resist (DFR) that is laminated upon seed metal layer 40 as described above so that underlying PE sheet 16 is peeled away from DFR 10 leaving PE cover sheet 12 over dry resist layer 14.

Dry resist layer 14 is from about 100,000 to 1,200,000 Å thick, and is more preferably from about 1,000,000 to 1,200,000 Å. Dry resist layer 14 is preferably a negative type photoresist material comprised of acrylic ester, acrylic polymer, acrylate monomer or benzophenone.

Wafer 18 includes ring-shaped area 60 proximate the edge 62 of wafer 18. Ring-shaped area 60 is preferably from about 1 to 3 mm wide and is more preferably about 2 mm wide.

PE Layer 12 Removal/Peel-off

Figure 5:
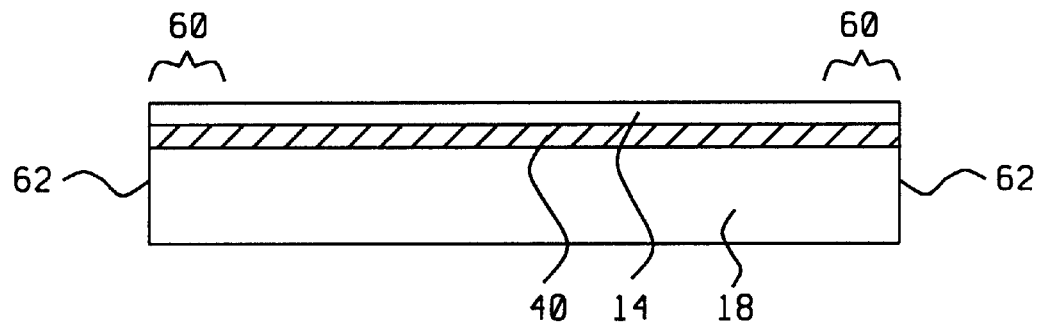

As shown in FIG. 5, PE layer 12 is peeled from underlying dry resist layer 14 by hand or by an automatic tape remover with adhesive tape to adhere the PE and to then peel it off.

Removal of Dry Resist Layer 14 from Ring-Shaped Area 60

Figure 6:
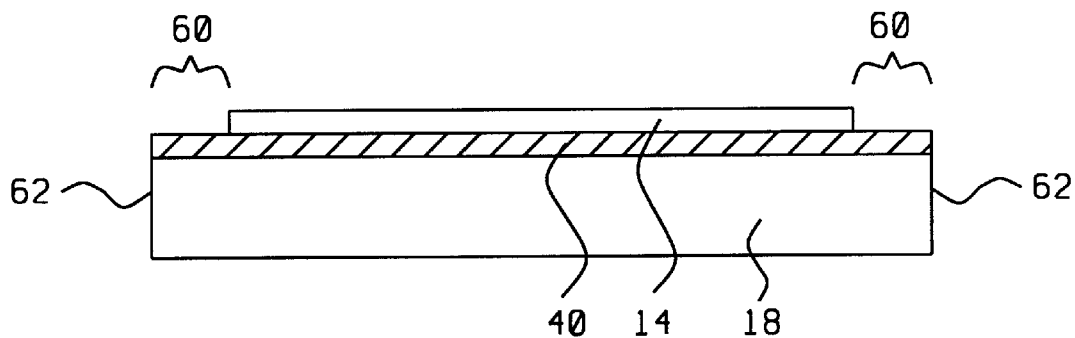

As shown in FIG. 6, that portion of dry resist layer 14 within ring-shaped area 60 is removed from seed metal layer 40, preferably through the use of an acetone edge rinse conducted at the following parameters to form acetone rinsed dry resist layer 14':

temperature—from about 20 to 25° C.;

acetone flow rate—from about 50 to 200 sccm; and for from about 30 to 60 seconds.

Compared to other commercial thinners, for example propylene glycol monomethyl ether and propylene glycol monomethyl ether acetate such as AZ EBR 7030, only acetone need be used to dissolve unexposed dry resist layer 14 within ring-shaped area 60.

Spin-Coat Water Soluble Polymer Top Coating 50 Upon Dry Resist Layer 14'

Figure 7:
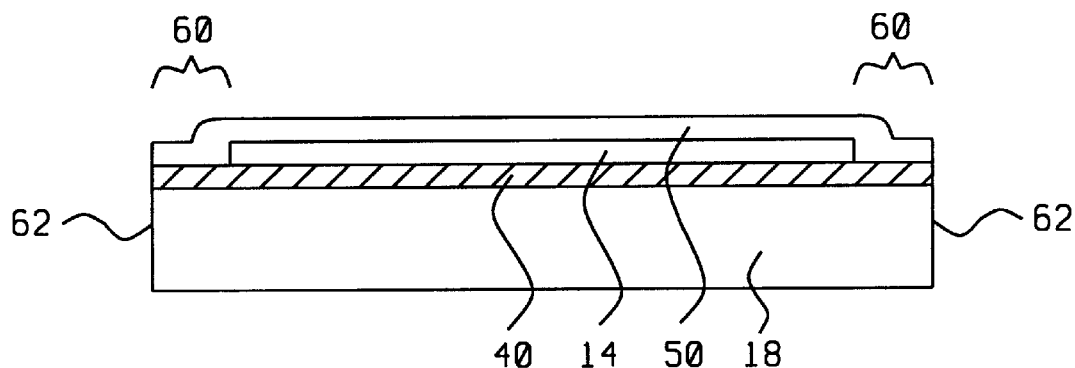

As shown in FIG. 7 and in a key step of the invention, a water soluble polymer top coating layer 50 is preferably spun upon acetone-rinsed unexposed dry resist layer 14'. Top coat polymer layer 50 is preferably from about 10,000 to 30,000 Å thick, and is more preferably from about 20,000 to 25,000 Å thick.

Top coat polymer layer 50 is an oxygen barrier, preventing oxygen diffusion through to the dry resist layer 14' before exposure of the dry resist layer 14', and also protects the underlying dry resist layer 14' against mechanical damage. Top coat polymer layer 50 is preferably comprised of polyvinyl alcohol (PVA:PVOH) (—$CH_2CHOH$—), poly (2-ethyl-2-oxazoline) (molecular weight from about 5000 to 500,000) or hydroxyethylcellulose and is more preferably comprised of polyvinyl alcohol. The polyvinyl alcohol has a specific gravity of from about 1.19 to 1.31, a percent hydrolysis of 99%±1.0% and is 100% soluble in water.

Polyvinyl alcohol is formed by the alcoholysis of polyvinyl acetate and forms films by evaporation from water solution. A commercial product to form polyvinyl alcohol is provided by Fuji-Hunt Electronics Technology Co., Ltd. is known as "CP" and is composed of polyvinyl acetate (PVA), isopropyl alcohol (IPA) and water.

Poly (2-ethyl-2-oxazoline) is also known as Aquazol, is highly soluble in water, thermally stable and may be substituted for the PVOH. The Technical Information Sheet; Poly (2-ethyl-2-oxazoline); CAS Number: 25805-17-18 discusses Aquazol and is incorporated by reference herein. Hydroxyethylcellulose is cellulose with the hydroxyl groups (OH) replaced with hydroxyethyl which makes hydroxyethylcellulose water soluble.

Exposure/Development of Dry Resist Layer 14' With Removal of Top Coat Polymer Layer 50

Figure 8:
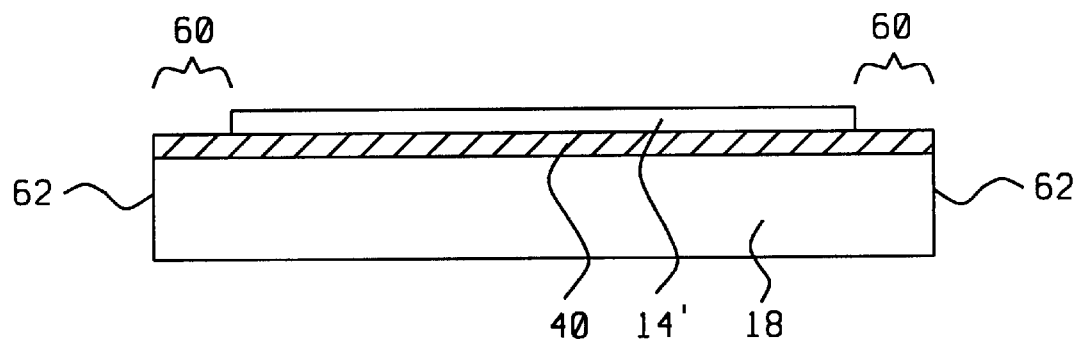
Figure 9:
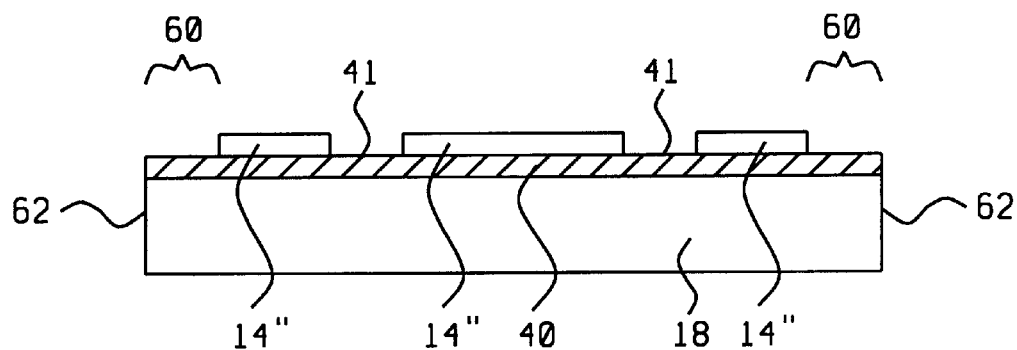

As shown in FIGS. 8 and 9, dry resist layer 14' is exposed and then water soluble polymer top coat layer 50 is rinsed away from dry resist layer 14' by an aqueous developer. Exposed dry resist layer 14' is developed, also preferably by the aqueous developer, to form patterned dry resist layer 14" as shown in FIG. 9. The aqueous developer is preferably from about a 0.5 to 1.8% $Na_2CO_3$ aqueous solution.

Patterned dry resist layer 14" exposes portions 41 of metal seed layer 40.

Contact Ring Shaped Electrode 64 to Wafer 18 at Ring-Shaped Area 60

Figure 10:
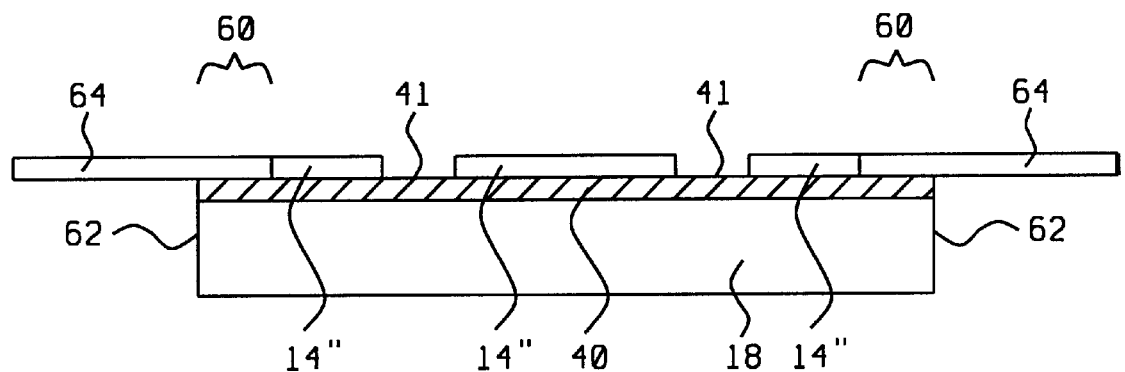

As shown in FIG. 10, ring shaped electrode 64 is contacted to the exposed seed metal layer 40 within ring-shaped area 60 proximate the edge 62 of wafer 18 to permit electrode bump metal formation or re-route trace according to conventional methods.

Electrode Bump Metal Formation or Re-Route Trace

Figure 11:
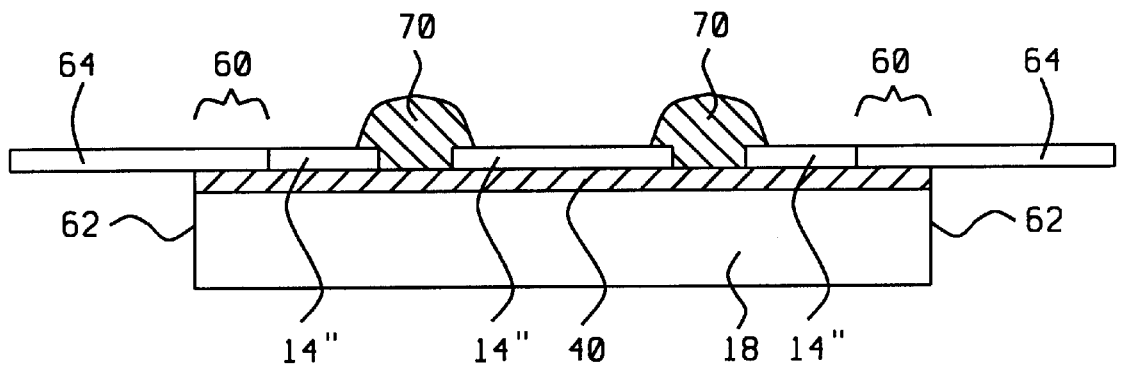

As shown in FIG. 11, bump metal formations 70 (or re-route trace—not shown) are then formed over the portions 41 of seed metal layer 40 exposed by patterned dry resist layer 14". Bump metal formations 70 may be mushroom bump metal formations as shown in FIG. 11 et al.

Remove Patterned Dry Photoresist 14"

Figure 12:
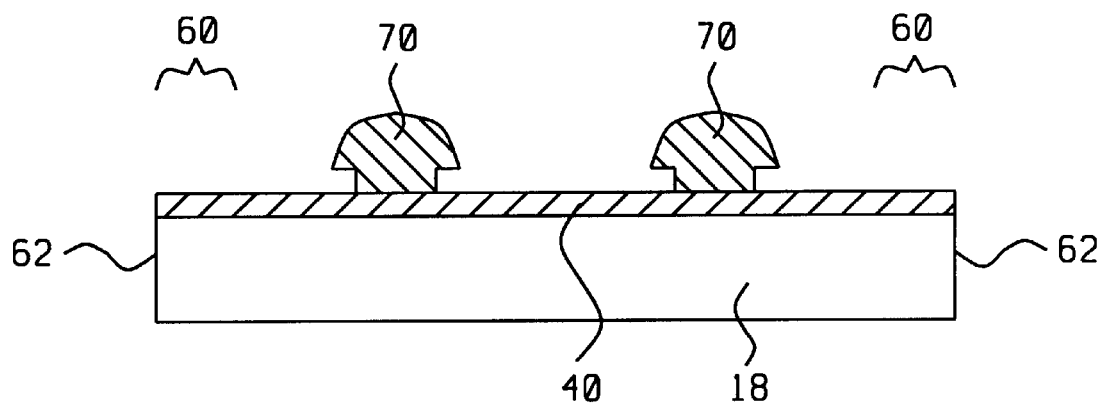

As shown in FIG. 12, ring shaped electrode 64 is removed from wafer 18. Patterned dry photoresist 14" is then removed from seed metal layer 40.

Seed Metal Layer 40 Etch

Figure 13:
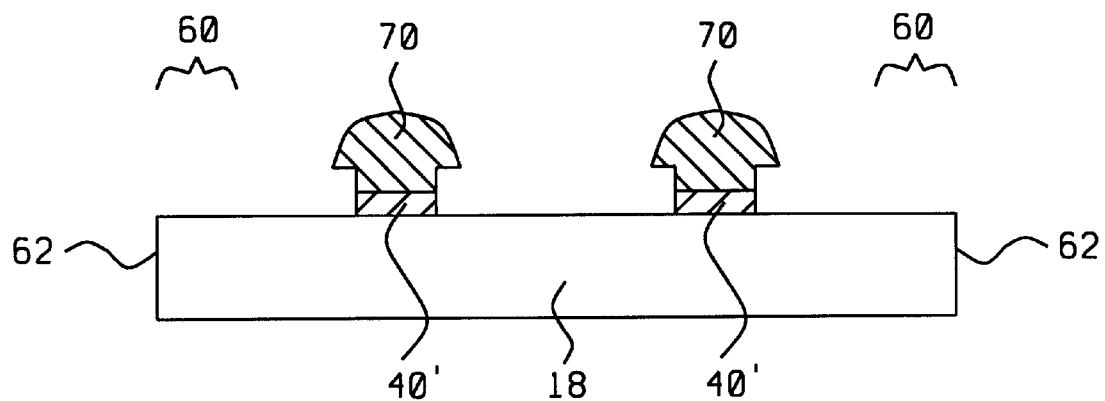

As shown in FIG. 13, seed metal layer 40 not under bump metal formations 70, for example, is etched from wafer 18 leaving etched seed metal layer portions 40' under bump metal formations 70.

While particular embodiments of the present invention have been illustrated and described, it is not intended to limit the invention, except as defined by the following claims.

We claim:
1. A method of clearing photoresist on a wafer edge, including the steps of:
   providing a wafer having a upper exposed conductive layer; the wafer having a center, an edge and a ring-shaped area proximate the wafer edge;
   forming a photoresist layer upon the exposed conductive layer;
   removing the photoresist layer from within the ring-shaped area by a rinse process to expose the conductive layer within the ring-shaped area; and
   forming an oxygen diffusion barrier layer over the photoresist layer.
2. The method of claim 1, including the steps of:
   exposing the photoresist layer; and
   simultaneously removing the oxygen diffusion barrier layer from the photoresist layer and developing the photoresist layer.
3. The method of claim 1, wherein the oxygen diffusion barrier layer is a water soluble polymer material selected from the group consisting of polyvinyl alcohol, poly (2-ethyl-2-oxazoline) and hydroxyethylcellulose.
4. The method of claim 1, wherein the oxygen diffusion barrier layer is comprised of polyvinyl alcohol.
5. The method of claim 1, wherein the ring-shaped area proximate the wafer edge is from about 1 to 3 mm wide.
6. The method of claim 1, wherein the ring-shaped area proximate the wafer edge is about 2 mm wide.
7. The method of claim 1, wherein the photoresist layer is comprised of a dry film resist.
8. The method of claim 1, wherein the photoresist layer is a dry film resist material selected from the group consisting of acrylic ester, acrylic polymer, acrylate monomer and benzophenone.
9. The method of claim 1, wherein the conductive layer is from about 1000 to 8000 Å thick; the photoresist layer is from about 100,000 to 1,200,000 Å thick; and the oxygen diffusion barrier layer is from about 10,000 to 30,000 Å thick.
10. The method of claim 1, wherein the conductive layer is from about 4000 to 6000 Å thick; the photoresist layer is from about 1,000,000 to 1,200,000 Å thick; and the oxygen diffusion barrier layer is from about 20,000 to 25,000 Å thick.
11. The method of claim 1, wherein the conductive layer is a metal seed layer.
12. The method of claim 1, wherein the oxygen diffusion barrier layer is water soluble; and including the steps of:
   exposing the photoresist layer; and
   simultaneously removing the oxygen diffusion barrier layer from the photoresist layer and developing the photoresist layer using an aqueous solution of from about 0.5 to 1% $Na_2CO_3$.
13. A method of clearing dry film resist on a wafer edge, including the steps of:
   providing a wafer having a upper exposed conductive layer; the wafer having a center, an edge and a ring-shaped area proximate the wafer edge;
   affixing a dry film resist layer upon the exposed conductive layer;
   removing the dry film resist layer from within the ring-shaped area by a rinse process to expose the conductive layer within the ring-shaped area; and
   forming an oxygen diffusion barrier layer over the dry film resist layer; the oxygen diffusion barrier layer being a material selected from the group consisting of polyvinyl alcohol, poly (2-ethyl-2-oxazoline) and hydroxyethylcellulose.
14. The method of claim 13, including the steps of:
   exposing the dry film resist layer; and
   simultaneously removing the oxygen diffusion barrier layer from the dry film resist layer and developing the dry film resist layer.
15. The method of claim 13, wherein the oxygen diffusion barrier layer is polyvinyl alcohol.
16. The method of claim 13, wherein the ring-shaped area proximate the wafer edge is from about 1 to 3 mm wide.

17. The method of claim 13, wherein the ring-shaped area proximate the wafer edge is about 2 mm wide.

18. The method of claim 13, wherein the dry film resist layer is a material selected from the group consisting of acrylic ester, acrylic polymer, acrylate monomer and benzophenone.

19. The method of claim 13, wherein the conductive layer is from about 1000 to 8000 Å thick; the dry film resist layer is from about 100,000 to 1,200,000 Å thick; and the oxygen diffusion barrier layer is from about 10,000 to 30,000 Å thick.

20. The method of claim 13, wherein the conductive layer is from about 4000 to 6000 Å thick; the dry film resist layer is from about 1,000,000 to 1,200,000 Å thick; and the oxygen diffusion barrier layer is from about 20,000 to 25,000 Å thick.

21. The method of claim 13, wherein the conductive layer is a metal seed layer.

22. The method of claim 13, wherein the oxygen diffusion barrier layer is water soluble; and including the steps of:

exposing the dry film resist; and simultaneously removing the oxygen diffusion barrier layer from the dry film resist layer and developing the photoresist layer using an aqueous solution of from about 0.5 to 1% $Na_2CO_3$.

23. A method of clearing dry film resist on a wafer edge, including the steps of:

providing a wafer having a upper exposed conductive layer; the wafer having a center, an edge and a ring-shaped area proximate the wafer edge; the conductive layer being from about 1000 to 8000 Å thick; the ring-shaped area being from about 1 to 3 mm wide;

affixing a dry film resist layer upon the exposed conductive layer; the dry film resist having a thickness of from about 100,000 to 1,200,000 Å;

removing the dry film resist layer from within the ring-shaped area by a rinse process to expose the conductive layer within the ring-shaped area; and forming a water soluble oxygen diffusion barrier layer over the photoresist layer; the oxygen diffusion barrier layer being from about 10,000 to 30,000 Å thick.

24. The method of claim 23, including the step of simultaneously removing the oxygen diffusion barrier layer from the dry film resist layer and developing the dry film resist layer.

25. The method of claim 23, wherein the oxygen diffusion barrier layer is a water soluble polymer material selected from the group consisting of polyvinyl alcohol, poly (2-ethyl-2-oxazoline) and hydroxyethylcellulose.

26. The method of claim 23, wherein the oxygen diffusion barrier layer is comprised of polyvinyl alcohol.

27. The method of claim 23, wherein the ring-shaped area proximate the wafer edge is about 2 mm wide.

28. The method of claim 23, wherein the dry film resist layer is a material selected from the group consisting of acrylic ester, acrylic polymer, acrylate monomer and benzophenone.

29. The method of claim 23, wherein the metal seed layer is from about 4000 to 6000 Å thick; the dry film resist layer is from about 1,000,000 to 1,200,000 Å thick; and the oxygen diffusion barrier layer is from about 20,000 to 25,000 Å thick.

30. The method of claim 23, including the steps of:

exposing the dry film resist; and simultaneously removing the oxygen diffusion barrier layer from the dry film resist layer and developing the photoresist layer using an aqueous solution of from about 0.5 to 1% $Na_2CO_3$.

31. A method of clearing photoresist on a wafer edge, including the steps of:

providing a wafer having a upper exposed conductive layer; the wafer having a center, an edge and a ring-shaped area proximate the wafer edge;

affixing a water soluble dry film resist layer upon the exposed conductive layer;

removing the dry film resist layer from within the ring-shaped area by a rinse process to expose the conductive layer within the ring-shaped area;

forming an oxygen diffusion barrier layer over the photoresist layer;

exposing the dry film resist layer; and simultaneously removing the oxygen diffusion barrier layer from the dry film resist layer and developing the dry film resist layer using an aqueous solution of from about 0.5 to 1% $Na_2CO_3$.

32. The method of claim 31, wherein the oxygen diffusion barrier layer is a material selected from the group consisting of polyvinyl alcohol, poly (2-ethyl-2-oxazoline) and hydroxyethylcellulose.

33. The method of claim 31, wherein the oxygen diffusion barrier layer is comprised of polyvinyl alcohol.

34. The method of claim 31, wherein the ring-shaped area proximate the wafer edge is from about 1 to 3 mm wide.

35. The method of claim 31, wherein the ring-shaped area proximate the wafer edge is about 2 mm wide.

36. The method of claim 31, wherein the photoresist layer is a material selected from the group consisting of acrylic ester, acrylic polymer, acrylate monomer and benzophenone.

37. The method of claim 31, wherein the conductive layer is from about 1000 to 8000 Å thick; the dry film resist layer is from about 100,000 to 1,200,000 Å thick; and the oxygen diffusion barrier layer is from about 10,000 to 30,000 Å thick.

38. The method of claim 31, wherein the metal seed layer is from about 4000 to 6000 Å thick; the dry film resist layer is from about 1,000,000 to 1,200,000 Å thick; and thick; oxygen diffusion barrier layer is from about 20,000 to 25,000 Å thick.

39. The method of claim 31, wherein the conductive layer is a metal seed layer.

* * * * *

UNITED STATES PATENT AND TRADEMARK OFFICE
CERTIFICATE OF CORRECTION

PATENT NO. : 6,623,912 B1  Page 1 of 1
DATED : September 23, 2003
INVENTOR(S) : Kai-Ming Ching et al.

It is certified that error appears in the above-identified patent and that said Letters Patent is hereby corrected as shown below:

<u>Title page,</u>
Item [75], Inventors, delete "Yu-Kung Hsiao, Tan-Yuan (TW)", and replace with -- Yu-Kung Hsiao, Tau-Yuan (TW) --.

Signed and Sealed this

Twenty-fifth Day of November, 2003

JAMES E. ROGAN
*Director of the United States Patent and Trademark Office*